(12) United States Patent
Takeya et al.

(10) Patent No.: US 12,068,093 B2
(45) Date of Patent: Aug. 20, 2024

(54) ORGANIC SEMICONDUCTOR ELEMENT, STRAIN SENSOR, VIBRATION SENSOR, AND MANUFACTURING METHOD FOR ORGANIC SEMICONDUCTOR ELEMENT

(71) Applicant: The University of Tokyo, Tokyo (JP)

(72) Inventors: Junichi Takeya, Tokyo (JP); Shunichiro Watanabe, Tokyo (JP); Yu Yamashita, Tokyo (JP); Keita Yaegashi, Tokyo (JP)

(73) Assignee: The University of Tokyo, Tokyo (JP)

( * ) Notice: Subject to any disclaimer, the term of this patent is extended or adjusted under 35 U.S.C. 154(b) by 741 days.

(21) Appl. No.: 17/272,585

(22) PCT Filed: Sep. 3, 2019

(86) PCT No.: PCT/JP2019/034672
§ 371 (c)(1),
(2) Date: May 14, 2021

(87) PCT Pub. No.: WO2020/050288
PCT Pub. Date: Mar. 12, 2020

(65) Prior Publication Data

US 2021/0328164 A1    Oct. 21, 2021

(30) Foreign Application Priority Data

Sep. 4, 2018  (JP) .................. 2018-165519

(51) Int. Cl.
*H01C 10/10*    (2006.01)
*H10K 10/20*    (2023.01)
(Continued)

(52) U.S. Cl.
CPC ............. *H01C 10/10* (2013.01); *H10K 10/20* (2023.02); *H10K 71/30* (2023.02); *H10K 77/111* (2023.02)

(58) Field of Classification Search
CPC ...... H01C 10/10; H10K 10/20; H10K 77/111; H10K 71/30
See application file for complete search history.

(56) References Cited

U.S. PATENT DOCUMENTS 10,074,818 B2    9/2018  Matsumoto et al.
10,497,888 B2   12/2019  Kleemann et al.
(Continued)

FOREIGN PATENT DOCUMENTS

CN    106744641 A     5/2017
EP      3252829 A1   12/2017
(Continued)

OTHER PUBLICATIONS

JP 2008235374 machine translation. (Year: 2008).*
(Continued)

*Primary Examiner* — Kyung S Lee
(74) *Attorney, Agent, or Firm* — Fox Rothschild LLP; Carol E. Thorstad-Forsyth

(57) ABSTRACT

An organic semiconductor element of the present invention includes: an organic semiconductor film formed from single crystal of an organic semiconductor, and a doped layer formed in a surface of the organic semiconductor film. A strain sensor of the present invention includes: the organic semiconductor element, a pair of electrodes which are electrically connected through the doped layer, and a substrate which is deformable, and which has the organic semiconductor element formed on one surface thereof. A vibration sensor of the present invention includes: the organic semiconductor element, a pair of electrodes which are electrically connected through the doped layer, and a substrate which has flexibility, and which is fixed at one end (Continued)

or both ends thereof, the substrate having the organic semiconductor element formed on the surface of the flexible portion of the substrate.

5 Claims, 8 Drawing Sheets

(51) Int. Cl.
*H10K 71/30* (2023.01)
*H10K 77/10* (2023.01)

(56) References Cited

U.S. PATENT DOCUMENTS

| | | | | |
|---|---|---|---|---|
| 10,854,831 | B2* | 12/2020 | Choi | H10K 10/484 |
| 2009/0066345 | A1 | 3/2009 | Klauk et al. | |
| 2014/0353647 | A1 | 12/2014 | Newsome et al. | |
| 2016/0155969 | A1 | 6/2016 | Matsumoto et al. | |
| 2017/0149001 | A1* | 5/2017 | Kleemann | H10K 10/84 |

FOREIGN PATENT DOCUMENTS

| | | |
|---|---|---|
| JP | 2007530957 A | 11/2007 |
| JP | 2008235374 A | 10/2008 |
| JP | 2011242153 A | 12/2011 |
| JP | 2015185620 A | 10/2015 |
| JP | 2016143675 A | 8/2016 |
| TW | 201515115 | 4/2015 |
| TW | 201539818 | 10/2015 |
| WO | 2016114061 A1 | 7/2016 |
| WO | 2016121791 A1 | 8/2016 |

OTHER PUBLICATIONS

Jacobs Ian E. et al. "Controlling Molecular Doping in Organic Semiconductors", Advanced Materials, vol. 29, No. 42, Nov. 15, 2017.

Extended European Search Report issued in European Patent Application No. 19858272.8 dated Apr. 28, 2022.

Hakamatani, Ryohei et al., "Strain effect in chemically-doped organic single-crystal semiconductors", Summaries of the 73rd annual conference of the Physical Society of Japan (2018), The Physical Society of Japan. Mar. 1, 2018, ISSN 2189-0803.

Yamashita, Yu et al., "Efficient carrier doping in polymeric semiconductors via anion exchange", Summaries of the 73rd annual conference of the Physical Society of Japan (2018), The Physical Society of Japan. Mar. 1, 2018, ISSN 2189-0803.

Yamashita, Yu et al., "Improved Efficiency of Molecular Doping in Polymeric Semiconductors via Anion Exchange", 2018 MRS Spring Meeting & Exhibt Meeting Program, EP08.03.05, [online], Mar. 16, 2018.

Yamashita, Yu et al., "Improved Efficiency of Molecular Doping in Polymeric Semiconductors via Anion Exchange", E-MRS 2018 Spring Meeting PROGRAM, [online], Mar. 16, 2018.

Yamashita, Yu et al., "Mechanism of a new method of doping via anion exchange in polymeric semiconductors", Summaries of the 2018 Autumn Meeting of the Physical Society of Japan, The Physical Society of Japan, Aug. 31, 2018, ISSN 2189-0803.

International Search Report issued in PCT/JP2019/034672 dated Nov. 26, 2019.

Yamashita, Yu et al. "High Efficiency Doping of Polymer Semiconductors Using Anion Exchange Method" The University of Tokyo, Organic Electronics 47, 139 (2017).

* cited by examiner

ORGANIC SEMICONDUCTOR ELEMENT, STRAIN SENSOR, VIBRATION SENSOR, AND MANUFACTURING METHOD FOR ORGANIC SEMICONDUCTOR ELEMENT

RELATED APPLICATION DATA

The present application is the U.S. National Phase of International Patent Application No. PCT/JP2019/034672, filed on Sep. 3, 2019 and entitled "ORGANIC SEMICONDUCTOR ELEMENT, STRAIN SENSOR, VIBRATION SENSOR, AND MANUFACTURING METHOD FOR ORGANIC SEMICONDUCTOR ELEMENT," which claims priority to Japanese Patent Application No. JP 2018-165519, filed on Sep. 4, 2018, the contents of which are incorporated herein by reference in their entireties.

TECHNICAL FIELD

The present invention relates to an organic semiconductor element, a strain sensor, a vibration sensor, and a method for producing an organic semiconductor element.

BACKGROUND ART

A strain sensor using an organic semiconductor element has been known (see, for example, PTL 1). The strain sensor of PTL 1 includes an organic semiconductor film which is formed on a substrate from a thin film of single crystal of an organic semiconductor, and a pair of electrodes which are connected to the organic semiconductor film. When a stress compressing or stretching the organic semiconductor film acts on the film, a distance between molecules of the organic semiconductor is changed to cause the molecular vibration to change, so that the mobility of carriers of the organic semiconductor film is changed. The change of the carrier mobility is detected as, for example, a change of the resistance of the organic semiconductor film, detecting strain.

CITATION LIST

Patent Literature

PTL 1: International Patent Publication No. WO 2016/121791

SUMMARY OF THE INVENTION

Technical Problem

As mentioned above, it has been known that the organic semiconductor can be used as a strain sensor or the like by detecting a change of the carrier mobility, but it is desired that the organic semiconductor for use as a sensor has a simple construction and a required resistance can be obtained from such an organic semiconductor.

In view of the above, the present invention has been made, and an object of the invention is to provide an organic semiconductor element which is advantageous in that a desired resistance can be obtained from the element having a simple construction, a strain sensor, a vibration sensor, and a method for producing an organic semiconductor element.

Solution to Problem

The organic semiconductor element of the present invention includes: an organic semiconductor film formed from single crystal of an organic semiconductor, and a doped layer formed in a surface of the organic semiconductor film.

The strain sensor of the present invention includes: the organic semiconductor element, a pair of electrodes which are electrically connected through the doped layer, and a substrate which is deformable, and which has the organic semiconductor element formed on one surface thereof.

The vibration sensor of the present invention includes: the organic semiconductor element, a pair of electrodes which are electrically connected through the doped layer, and a substrate which has flexibility, and which is fixed at one end or both ends thereof, the substrate having the organic semiconductor element formed on the surface of the flexible portion of the substrate.

The method for producing an organic semiconductor element of the present invention includes the steps of: forming an organic semiconductor film formed from single crystal of an organic semiconductor on a substrate; and forming a dopant film for supplying carriers to a surface of the organic semiconductor film.

Advantageous Effects of the Invention

According to the present invention, by forming a doped layer in a surface of an organic semiconductor film formed from single crystal of an organic semiconductor, the crystal structure of the organic semiconductor film is prevented from breaking, achieving an organic semiconductor element which is advantageous in that a desired resistance can be obtained from the element having a simple construction.

Further, according to the present invention, by forming a dopant film on the surface of the organic semiconductor film, doping can be advantageously made without breaking the crystal structure of the organic semiconductor film.

DESCRIPTION OF EMBODIMENTS

Figure 1:
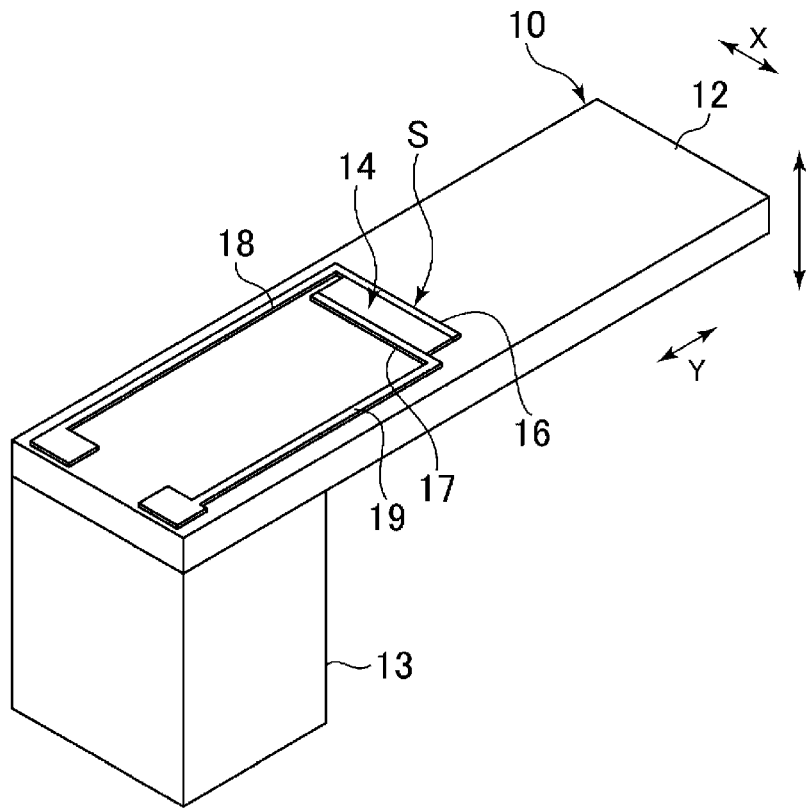
FIG. 1 A perspective view showing the appearance of a vibration sensor according to an embodiment of the invention.

In FIG. 1, a vibration sensor 10 has a substrate 12, and a sensor portion S including an organic semiconductor element 14 formed on the surface of the substrate 12. The vibration sensor 10 detects vibration of an object to be detected (detection object) using the organic semiconductor element 14 as a strain detecting element. A sensor having the same structure as that of the vibration sensor 10 can be used as an acceleration sensor for detecting acceleration or various types of sensors for detecting inclination or movement of a detection object.

The substrate 12 is a member in a rectangular plate form having flexibility, namely, being elastically deformable. The substrate 12 is fixed to a leg 13 at one end thereof as viewed in the longitudinal direction of the substrate (Y direction), and thus the vibration sensor 10 has a cantilever structure. The leg 13 is formed from a hard material, and fixed to a detection object. By virtue of this, when an acceleration in the vertical direction is caused in the detection object due to vibration, the substrate 12 elastically deforms in the amount and direction according to the acceleration so that another end of the substrate 12 moves in the vertical direction. In this example, an explanation is made on the case where the vertical vibration is detected, but the direction of the vibration detected is not limited to this. For example, when vibration (acceleration) in the horizontal direction to be detected, the vibration sensor 10 may be fixed to a detection object so as to be in the state in which the surface of the substrate 12 on which the sensor portion S is formed faces the right or left.

The sensor portion S is formed on one surface (upper surface in this example) of the substrate 12. The sensor portion S has the organic semiconductor element 14, a pair of electrodes 16, 17, and lead wires 18, 19. The organic semiconductor element 14 is formed in a rectangular form having a longer side in the width direction of the substrate 12 (X direction perpendicular to the Y direction). Elastic deformation of the substrate 12 causes the organic semiconductor element 14 to be stretched or compressed in the longitudinal direction of the substrate 12. It is preferred that the organic semiconductor element 14 is placed in the position in which stretching or compression is large when the substrate 12 elastically deforms.

The pair of the electrodes 16, 17 are arranged at both ends of the organic semiconductor element 14 as viewed in the longitudinal direction of the substrate 12, namely, in the direction along which the organic semiconductor element 14 is stretched or compressed. An end of the lead wire 18 is connected to the electrode 16, and an end of the lead wire 19 is connected to the electrode 17. The lead wires 18, 19 are formed in a pattern such that another end of each lead wire extends to the one end of the substrate 12, and the organic semiconductor element 14 is connected to an external electric device through the lead wires 18, 19.

Figure 2:
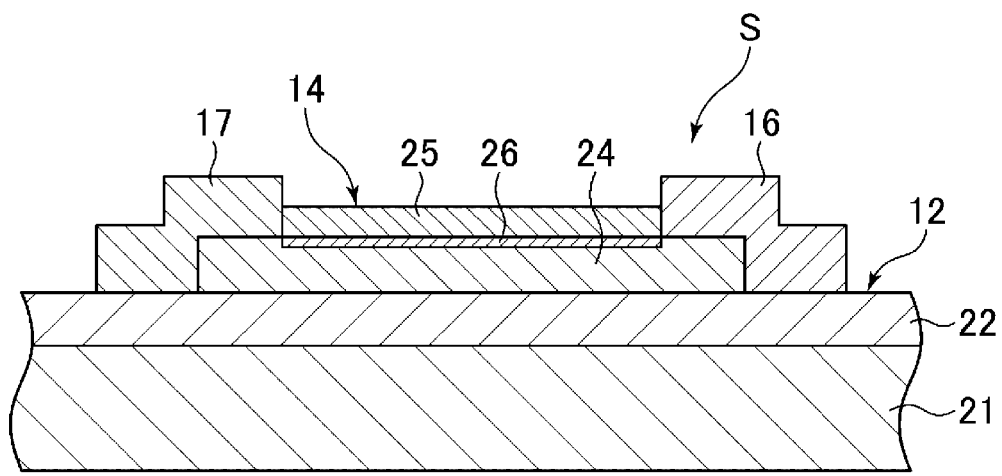
FIG. 2 A cross-sectional view showing the structure of the vibration sensor.

As shown in FIG. 2, the substrate 12 in this example is of a two-layer structure having a glass plate 21 and a resin layer 22 formed on the surface of the glass plate 21, and the organic semiconductor element 14 is formed on the surface of the resin layer 22. The resin layer 22 is formed from, for example, polyparaxylene (Parylene (registered trademark)). The glass plate 21 has a thickness of, for example, 100 to 500 μm, and the resin layer 22 has a thickness of about 20 to 200 μm. With respect to the material and structure constituting the substrate 12, there is no particular limitation, and, instead of the glass plate 21, for example, a substrate in a plate form obtained from polyethylene naphthalate (PEN) may be used, or a substrate 12 composed solely of polyethylene naphthalate may be used.

The organic semiconductor element 14 has an organic semiconductor film 24 formed on the surface of the resin layer 22, and a dopant film 25 formed on the upper surface of the organic semiconductor film 24. At both ends of the organic semiconductor film 24, the electrodes 16, 17 are formed from gold (Au). The organic semiconductor film 24 is formed from crystal of an organic semiconductor (organic compound which exhibits properties of a semiconductor), and is a film formed from the single crystal. The organic semiconductor film 24 has a thickness of, for example, 10 nm or less. With respect to the organic semiconductor constituting the organic semiconductor film 24, for example, 3,11-dioctyldinaphtho[2,3-d:2',3'-d']benzo[1,2-b:4,5-b']di thiophene (C8-DNBDT) which serves as a P type organic semiconductor is used.

As the P type organic semiconductor constituting the organic semiconductor film 24, there can be used the above-mentioned C8-DNBDT, or 3,11-didecyldinaphtho[2,3-d:2',3'-d']benzo[1,2-b:4,5-b']di thiophene (C10-DNBDT), 3,9-dihexyldinaphtho[2,3-b;2',3-d]thiophene (C6-DNT), 2,9-dinaphtho[2,3-b:2',3'-f]thieno[3,2-b]thiophene (C10-DNTT), 2,7-dioctylbenzothieno[3,2-b][1]benzothiophene (C8-BTBT), 6,13-bis(triisopropylsilylethynyl) pentacene, or the like. The organic semiconductor constituting the organic semiconductor film 24 may be of an N type. With respect to the N type organic semiconductor, dicyanoperylene-3,4:9,10-bis(dicarboxyimide) or the like can be used.

The dopant film 25, which is a film formed from a dopant, is used for forming a doped layer 26 in the surface of the organic semiconductor film 24 (the interface with the dopant film 25). The dopant film 25 is formed in the form of a thin film on the surface of the organic semiconductor film 24 between the electrodes 16, 17. As a dopant material for forming the dopant film 25, for example, 2,3,5,6-tetrafluoro-7,7,8,8-tetracyano-quinodimethane (F$_4$TCNQ, CAS No. (29261-33-4)) is used.

Figure 3:
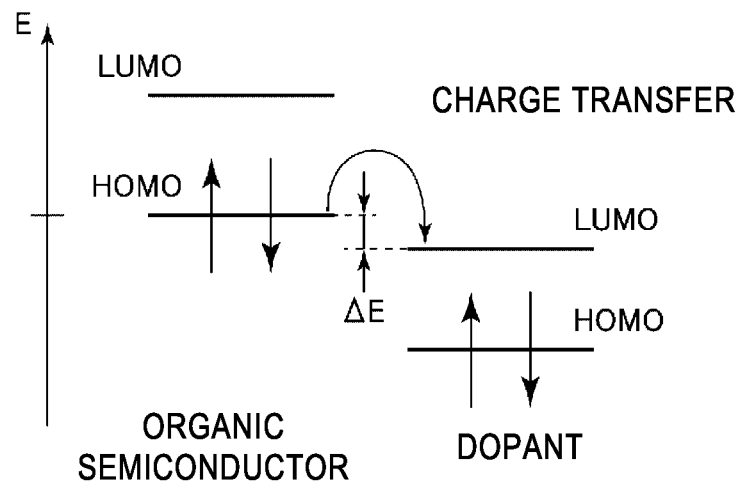
FIG. 3 An explanatory view showing the relationship between the HOMO of an organic semiconductor and the LUMO of a dopant.

By forming the dopant film 25, a charge transfer complex of the dopant and the organic semiconductor is formed at the interface between the organic semiconductor film 24 and the dopant film 25. Specifically, as shown in FIG. 3, charge transfer occurs between the HOMO (Highest Occupied Molecular Orbital) of the organic semiconductor in the organic semiconductor film 24 and the LUMO (Lowest Unoccupied Molecular Orbital) of the dopant constituting the dopant film 25, so that carriers (holes in this example) move to the surface of the organic semiconductor film 24, forming the doped layer 26.

When the P type organic semiconductor is used as the organic semiconductor film 24, the dopant constituting the dopant film 25 may be any dopant as long as it satisfies the following relationship that: the energy level ($E_{LUMO}$) of the LUMO of the dopant is a value which is lower than the energy level ($E_{HOMO}$) of the HOMO of the organic semiconductor in the organic semiconductor film 24 by about 1 eV ($E_{HOMO}-1$) or more ($E_{LUMO} > E_{HOMO}-1$). When the N type organic semiconductor is used as the organic semiconductor film 24, the dopant constituting the dopant film 25 may be any dopant as long as it satisfies the following relationship that: the energy level ($E'_{HOMO}$) of the HOMO of the dopant is a value which is higher than the energy level ($E'_{LUMO}$) of the LUMO of the organic semiconductor in the organic semiconductor film 24 by about 1 eV ($E'_{LUMO}+1$) or less ($E'_{HOMO} < E'_{LUMO}+1$).

Examples of dopant materials for the P type organic semiconductor include the above-mentioned $F_4TCNQ$, molybdenum tris-1-trifluoroacetyl-2-trifluoromethylethane-1,2-dithiolene ($Mo(tfd-COCF_3)_3$), and nitrosonium hexafluoroantimonate ($NO^+SbF_6^-$). Examples of dopant materials for the N type organic semiconductor include cobaltocene, decamethylcobaltocene, ruthenocene, ferrocene, and 1,3-dimethyl-2-phenyl-2,3-dihydro-benzoimidazole. In these dopant materials, some are of a type that the material itself becomes anion or cation and functions as a dopant, and some are of a type that a part of the material is dissociated and functions as a dopant. For example, as shown in the formulae (1) and (2) below, $F_4TCNQ$ and $Mo(tfd-COCF_3)_3$ are an example of the former, and, as shown in the formula (3) below, $NO^+SbF_6^-$ is an example of the latter. The formulae (1) to (3) show the case that the material functions as a dopant for the organic semiconductor film 24 formed from C8-DNBDT.

[Math. 1]

$$C_8DNBDT + F_4TCNQ \rightarrow [C_8DNBDT]^+[F_4TCNQ]^- \quad (1)$$

$$C_8DNBDT + Mo(tfd-COCF_3)_3 \rightarrow \quad (2)$$
$$[C_8DNBDT]^+[Mo(tfd-COCF_3)_3]^-$$

$$C_8DNBDT + NO^+SbF_6^- \rightarrow [C_8DNBDT]^+[SbF_6]^- + NO(gas) \quad (3)$$

A procedure for producing the organic semiconductor element 14 is described below. The procedure described below is an example, and the procedure is not limited to this example. When the organic semiconductor element 14 is produced, the formation of the organic semiconductor film 24, the formation of the electrodes 16, 17, and the formation of the dopant film 25 are successively conducted.

Figure 4:
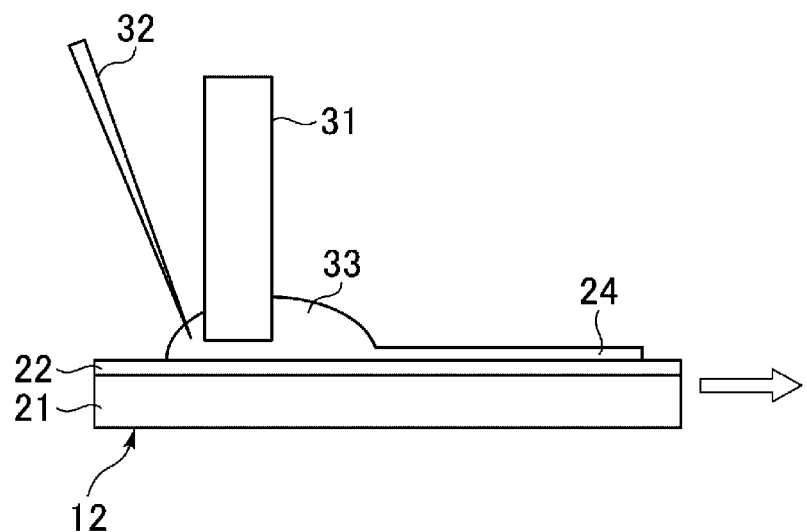
FIG. 4 An explanatory view showing the step of forming an organic semiconductor film.

As shown in FIG. 4, the organic semiconductor film 24 is formed by, for example, an edge casting method. In the edge casting method, a blade 31 is arranged above the substrate 12 so that the blade is substantially vertical with respect to the substrate 12. In this instance, the position of the blade 31 is controlled in the vertical direction so that the gap between the substrate 12 and the lower end of the blade 31 becomes larger than the thickness of the organic semiconductor film 24 to be formed. While moving the substrate 12 in one direction (direction to the right in the example of FIG. 4), a solution 33 is supplied to the position between the substrate 12 and the lower end of the blade 31. In this instance, the solution 33 is supplied through a supply pipe 32 on the side upstream of the blade 31 as viewed in the moving direction of the substrate 12 (on the left side of the blade 31 in the example of FIG. 4). The solution 33 is obtained by dissolving in a solvent an organic semiconductor which constitutes the organic semiconductor film 24. As the solvent, for example, an aromatic compound (such as o-dichlorobenzene) can be used.

In the above-mentioned movement of the substrate 12 and supply of the solution 33, the solvent of the solution 33 is evaporated wherein the solution 33 is present in the position which is away from the blade 31 and downstream of the blade 31 as viewed in the moving direction, so that the organic semiconductor is precipitated. Thus, a thin film of single crystal of the organic semiconductor, which constitutes the organic semiconductor film 24, is formed. In this example, the substrate 12 is moved, but there is only a need that the substrate 12, the blade 31, and the supply pipe 32 be relatively moved, and therefore, for example, the blade 31 and the supply pipe 32 may be moved, instead of moving the substrate 12.

With respect to the solution 33, a solution having dissolved in a solvent a polymer material and an organic semiconductor which constitutes the organic semiconductor film 24 may be used. When using such a solution 33, a polymer layer composed of the polymer material and a layer composed of the organic semiconductor, i.e., the organic semiconductor film 24 are separated from each other during the process in which the solvent is evaporated. Thus, the organic semiconductor film 24 in which the organic semiconductor is more advantageously oriented and crystallized is formed on the polymer layer.

Examples of the polymer materials include a polymethyl methacrylate resin, poly(4-methylstyrene), poly(triarylamine), polystyrene, polyacrylonitrile, polyethylene, and polyvinyl acetate. With respect to the solvent, there is no particular limitation as long as it can dissolve therein both an organic compound and a polymer, for example, a halogen aromatic solvent, such as chlorobenzene, 3-chlorothiophene, or 1-chloronaphthalene, a hydrocarbon solvent, such as hexane or heptane, or a non-halogen aromatic solvent, such as toluene, xylene, or tetralin, can be used.

After forming the organic semiconductor film 24, the electrodes 16, 17 are formed. The electrodes 16, 17 as well as the lead wires 18, 19 are formed by, for example, vapor deposition.

Figure 5:
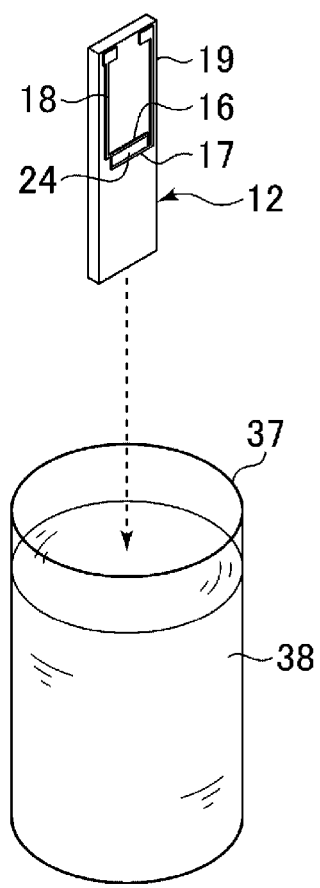
FIG. 5 An explanatory view showing the step of forming a dopant film.

After forming the electrodes 16, 17, the dopant film 25 is formed. For example, as shown in FIG. 5, together with the substrate 12, the organic semiconductor film 24 is immersed in a solution 38 in a container 37, and then the solvent is evaporated to form the dopant film 25 on the surface of the organic semiconductor film 24. The solution 38 is obtained by dissolving a dopant material in a solvent. As the solvent, acetonitrile, butyl acetate, or the like can be used. The dopant film 25 is formed as mentioned above, so that the doped layer 26 is formed.

The method for forming the dopant film 25 is not limited to the above-mentioned method. For example, the dopant film 25 may be formed on the organic semiconductor film 24 by dropwise adding and spreading a solution having a dopant dissolved therein to the surface of the organic semiconductor film 24, and then evaporating the solvent. Alternatively, the dopant film 25 may be formed by vapor deposition of a dopant on the surface of the organic semiconductor film 24.

Elastic deformation of the substrate 12 causes the organic semiconductor element 14, i.e., the organic semiconductor film 24 having the doped layer 26 to be compressed or stretched. In this example, the organic semiconductor element 14 is formed on the upper surface of the substrate 12, and therefore, when the substrate 12 flexes so that another end of the substrate 12 moves downwardly, the organic semiconductor film 24 is stretched, and, when the substrate 12 flexes so that another end of the substrate 12 moves upwardly, the organic semiconductor film 24 is compressed. The organic semiconductor film 24 changes in the mobility of carriers according to the compression or stretching, i.e., strain. By detecting the change of the carrier mobility as a change of the resistance of the organic semiconductor element 14 through the electrodes 16, 17, an acceleration of the detection object can be detected.

Figure 6:
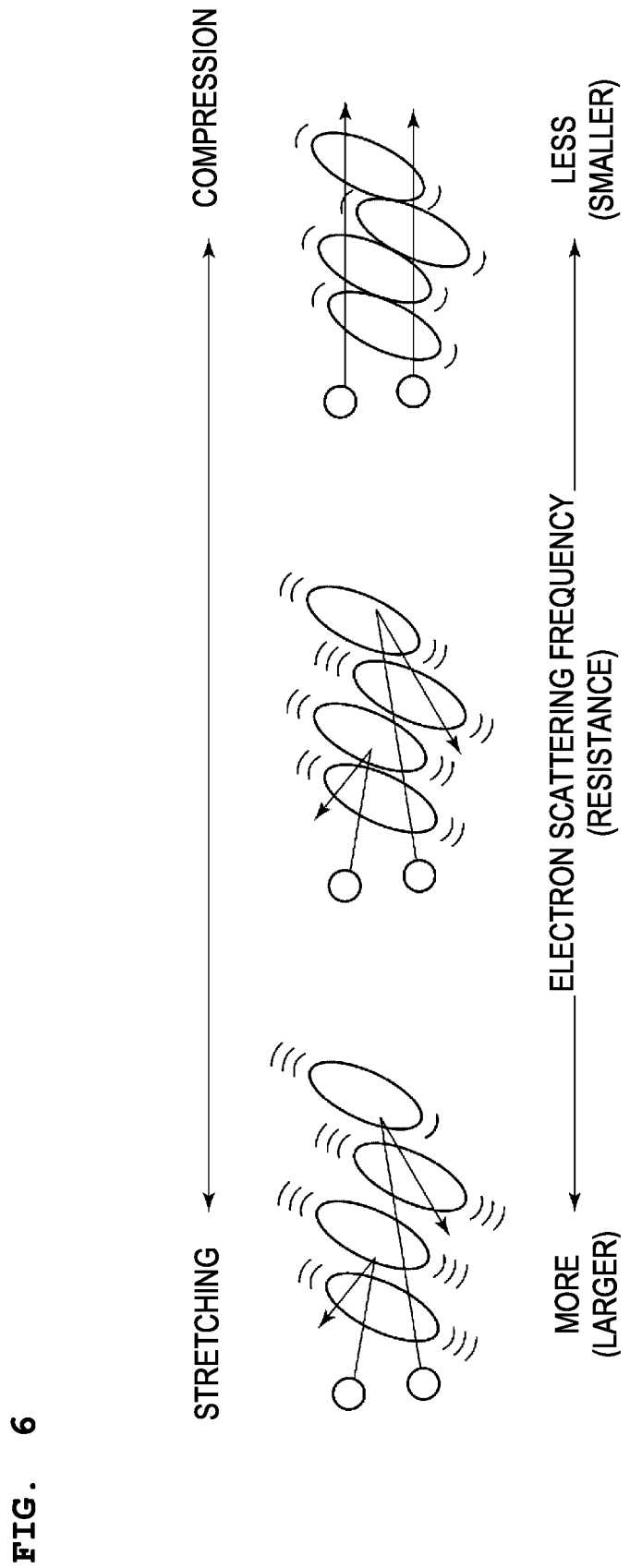
FIG. 6 An explanatory view showing the relationship between the strain of the organic semiconductor film and the mobility of carriers.

The reason that the mobility of carriers in the organic semiconductor film 24 changes according to the strain is presumed as follows. As can be seen from the state of molecules of the organic semiconductor in the organic semiconductor film 24 diagrammatically shown in FIG. 6, when the organic semiconductor film 24 is compressed so that a stress in compression acts on the organic semiconductor film 24, strain is caused in the crystal and the molecules are close to each other, which makes it easier for carriers to move through the organic semiconductor, increasing the mobility of carriers. Further, when the molecules are close to each other, the molecular vibration becomes small, which makes it easier for carriers to move through the organic semiconductor film 24, increasing the mobility of carriers. Conversely, when the organic semiconductor film 24 is stretched so that a stress in tension acts on the organic semiconductor film 24, strain is caused in the crystal and the molecules are apart from each other, which makes it more difficult for carriers to move through the organic semiconductor, reducing the mobility of carriers. Further, when the molecules are apart from each other, the molecular vibration becomes large, which makes it more difficult for carriers to move through the organic semiconductor film 24, reducing the mobility of carriers. As the stress in compression or the stress in tension is increased, the strain caused in the crystal of the organic semiconductor film 24 is increased, and hence a change of the carrier mobility is increased. The organic semiconductor film 24 formed from single crystal has properties such that a change of the mobility of carriers is increased as the strain applied to the film is increased.

The organic semiconductor film 24 formed from single crystal has such a high detection sensitivity that a change of the resistance of the organic semiconductor film 24 in accordance with the strain is well detected. Further, the organic semiconductor film 24 has such a high response property that the resistance changes with a short delay in accordance with the change of the acceleration of vibration. Therefore, the vibration sensor 10 is advantageous in that the resistance of the organic semiconductor film 24 changes following even a high-speed change of the acceleration, enabling detection of vibration at a high frequency, and thus is useful as a vibration sensor.

With respect to a polycrystalline organic semiconductor, the individual organic semiconductor films have different crystal structures, and therefore, even when the same strain is caused in the organic semiconductor films by applying the same stress, the same mobility of carriers cannot be obtained. In contrast, the organic semiconductor film 24 in this example is formed from single crystal, and the crystal structure is determined according to the molecules of the organic compound. Further, as mentioned above, only the surface of the organic semiconductor film 24 is doped, and therefore the crystal structure is not disordered. For this reason, the individual organic semiconductor films 24 have the same crystal structure, and, when the same strain is caused in the organic semiconductor films by applying the same stress, the same mobility of carriers can be obtained. Therefore, the individual organic semiconductor films 24 have identical properties.

Further, in the organic semiconductor film 24 in this example, the doped layer 26 is formed in the surface of the organic semiconductor film, and the doped layer 26 has a large electrical conductivity, as compared to the other portion of the organic semiconductor film 24. For this reason, in the organic semiconductor element 14 in this example, a change of the resistance of the doped layer 26 is detected as a change of the resistance of the organic semiconductor film 24 between the electrodes 16, 17. With respect to the organic semiconductor film 24, in the case where the doped layer 26 is not formed, that is, the organic semiconductor film is not doped, it is likely that the organic semiconductor film has such a high resistance that a satisfactory current (gage current) does not flow unless a high voltage is applied, but, by doing the organic semiconductor film, the resultant film is a resistance element through which a satisfactory gage current flows even at a low voltage. Further, by virtue of forming the doped layer 26, there is no need to employ a three-terminal construction having a gate electrode formed on the surface of the organic semiconductor film 24, and the organic semiconductor film 24 can be used as a resistance element having a simple construction such that the resistance is changed according to strain. In addition, the single crystal structure of the organic semiconductor film 24 is not disordered by the doped layer 26, and hence deterioration of the properties of the organic semiconductor film 24 formed from single crystal does not occur.

When detecting vibration of an object to be detected (detection object) using the vibration sensor 10 having the above-described construction, the leg 13 is fixed to the detection object. A measuring apparatus is connected to the lead wires 18, 19.

When the detection object vibrates, the substrate 12 elastically deforms so that another end of the substrate moves in the vertical direction due to inertia force. The elastic deformation of the substrate 12 causes the organic semiconductor film 24 having the doped layer 26 to be compressed or stretched. As a result, the strain of the organic semiconductor film 24 is changed, so that the mobility of carriers of the doped layer is changed, that is, the resistance of the organic semiconductor element 14 is changed. When the substrate 12 elastically deforms in such a direction that another end of the substrate 12 moves upwardly as viewed from one end, the organic semiconductor film 24 is compressed, and therefore the carrier mobility is increased and the resistance of the organic semiconductor element 14 is reduced. Meanwhile, when the substrate 12 elastically deforms in such a direction that another end of the substrate 12 moves downwardly as viewed from one end, the organic semiconductor film 24 is stretched, and therefore the carrier mobility is reduced and the resistance of the organic semiconductor element 14 is increased. According to the amount of deformation of the substrate 12, the amount of compression or stretching of the organic semiconductor film is changed, obtaining a resistance of the organic semiconductor film 24, which is increased or reduced according to the change. Thus, the vibration is detected by the vibration sensor 10.

Figure 7:
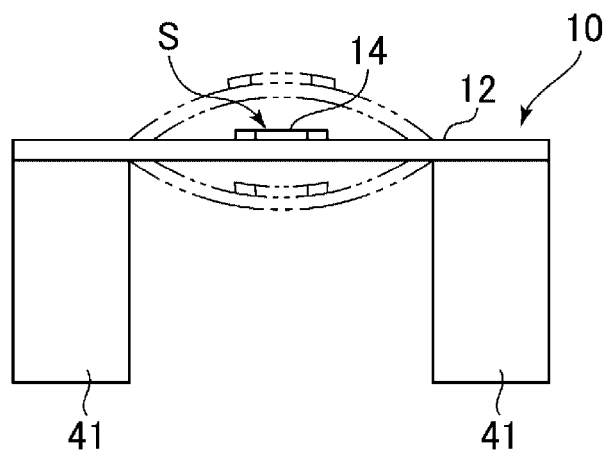
FIG. 7 An explanatory view showing an example of the vibration sensor in which a substrate is fixed at both ends thereof.

The vibration sensor 10 in the above-mentioned example is of a cantilever structure, but may be of a both-end-fixed beam structure in which, as shown in FIG. 7, both ends of the substrate 12 having the sensor portion S formed thereon are fixed with a pair of legs 41.

Figure 8:
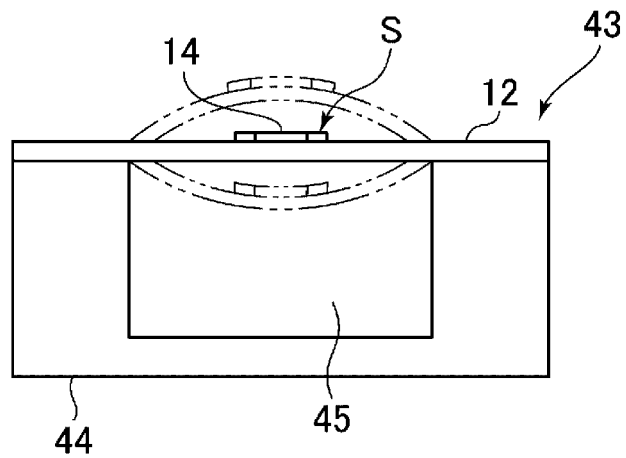
FIG. 8 An explanatory view showing an example of a pressure sensor using the organic semiconductor element.

The vibration sensor in the above-mentioned example is an example of the application of a vibration sensor using the organic semiconductor element. FIG. 8 shows an example of a diaphragm-type pressure sensor 43 using the organic semiconductor element 14. The pressure sensor 43 has the substrate 12 having the sensor portion S formed thereon and a container 44. The construction of the sensor portion S and that of the substrate 12 are similar to those in the above-mentioned example. The container 44 is in a hollow box form having an opening in one side, and the opening is airtightly closed using the substrate 12. In the pressure sensor 43, a difference between the pressure of a space 45 inside the container 44 and the pressure outside the container 44 causes the substrate 12 to suffer elastic deformation, so that the organic semiconductor element 14 is compressed or stretched according the deformation of the substrate. The outside pressure can be detected as a resistance of the organic semiconductor film 24.

Alternatively, for example, a strain sensor may be constructed in which only a resin layer, such as polyparaxylene, constitutes the substrate 12 on which the sensor portion S is formed so that the substrate is in a film form which is deformable in bend or stretchable. In such a strain sensor, the substrate 12 of the sensor is fixed to the surface of a detection object by bonding or the like, enabling detection of strain of the surface of the detection object.

Figure 9:
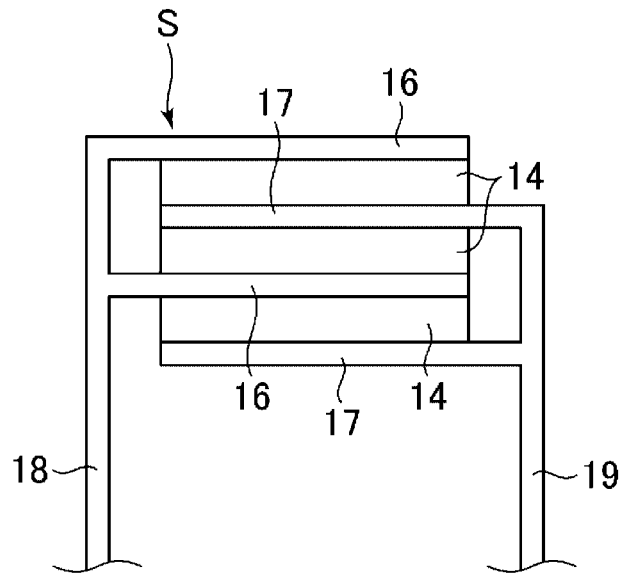
FIG. 9 An explanatory view showing an example in which electrodes for the organic semiconductor element are formed in a shape like teeth of a comb.

In each of the above-described examples, a single organic semiconductor element is formed between a pair of electrodes, but a construction may be employed such that, as shown in FIG. 9, the electrodes 16, 17 are individually formed in a shape like the teeth of a comb, and the organic semiconductor element 14 is formed between each electrode 16 and each electrode 17 to form one sensor portion S. In such a construction, it is possible to control a resistance of the element between the electrode 16 and the electrode 17.

Next, an example of doping via ion exchange is described. Doping via ion exchange is a method in which an intermediate of the organic semiconductor in the organic semiconductor film and a substance different from the intended dopant (hereinafter, referred to as "initiator dopant") is formed, and then the initiator dopant is replaced by an ultimate dopant (ion) via ion exchange to form a charge transfer complex of the organic semiconductor in the organic semiconductor film 24 and the ultimate dopant. In the doping made by this method, the doping amount can be considerably increased.

When the organic semiconductor in the organic semiconductor film 24 is taken as "A", the initiator dopant is taken as "B", an ion capable of forming a salt, together with the ultimate dopant (ion) (hereinafter, referred to as "spectator ion") is taken as "C", and the ultimate dopant (ion) (hereinafter, referred to as "alternative ion" in the case of this ion exchange) is taken as "D", doping via ion exchange can be represented by the following formula (4) in the case where the organic semiconductor is of a P type, and can be represented by the following formula (5) in the case where the organic semiconductor is of an N type.

[Math. 2]

$$A + B + C + D \rightarrow [A]^+[B]^- + [C]^+ + [D]^- \rightarrow [A]^+[D]^- + [C]^+ + [B]^- \quad (4)$$

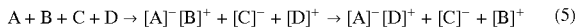

$$A + B + C + D \rightarrow [A]^-[B]^+ + [C]^- + [D]^+ \rightarrow [A]^-[D]^+ + [C]^- + [B]^+ \quad (5)$$

In doping via ion exchange, a treatment liquid 50 (see FIG. 10) is prepared by dissolving an initiator dopant having the same polarity (anion or cation) as that of the alternative ion in an ionic liquid which is a liquid of a salt composed of a spectator ion and an alternative ion. The salt composed of a spectator ion and an alternative ion need not be in a liquid state by itself, and may be dissolved in an organic solvent, such as acetonitrile or butyl acetate. The substrate 12 having the organic semiconductor film 24 formed thereon is immersed in the treatment liquid 50 for a predetermined period of time, and then the substrate 12 is removed from the treatment liquid 50, and the surface of the substrate is dried by air blow or the like. As a result, the alternative ion adsorbs on the surface of the organic semiconductor film 24 to form the doped layer 26 in the surface (interface) of the organic semiconductor film 24. In this instance, an extremely thin dopant film 25 composed of the alternative ion which has adsorbed is formed on the surface of the organic semiconductor film 24.

The alternative ion is a first ion which serves as a dopant, and the initiator dopant (ion) is a second ion which oxidizes or reduces the organic semiconductor. When doping is conducted by ion exchange, for example, the treatment liquid 50 may be applied, dropwise added, and spread to the surface of the organic semiconductor film 24 as long as a reaction can be caused as mentioned above by allowing the treatment liquid 50 to be in contact with the surface of the organic semiconductor film 24.

Figure 10:
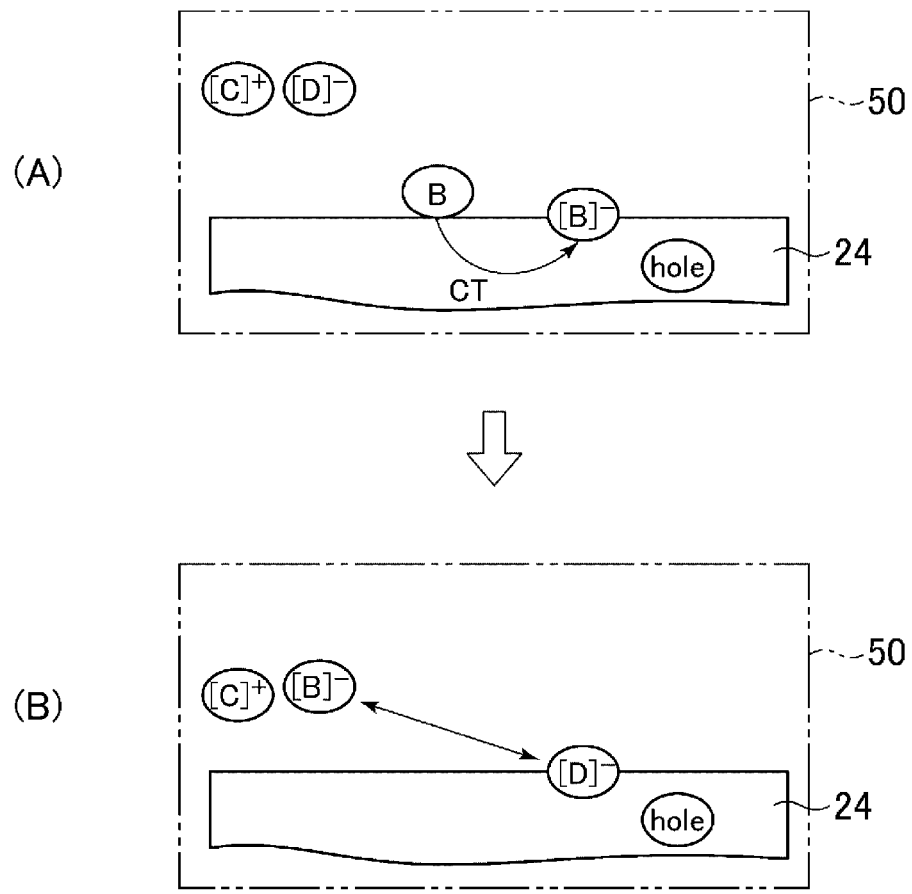
FIG. 10 Explanatory views showing the state of doping the organic semiconductor film using ion exchange.

As seen from the state of the organic semiconductor film being doped, diagrammatically shown in FIG. 10, in the case where the organic semiconductor in the organic semiconductor film 24 is of a P type, when the organic semiconductor film 24 is immersed in the treatment liquid 50, a redox reaction of the organic semiconductor and the initiator dopant represented by the formula (6) below is caused on the surface of the organic semiconductor film 24 (FIG. 10(A)). Specifically, an intermediate ($[A]^+[B]^-$) composed of the organic semiconductor (cation $[A]^+$) and the initiator dopant (anion $[B]^-$) is formed, and, in this instance, charge transfer occurs between the organic semiconductor and the initiator dopant, so that carriers (holes in this example) are injected into the organic semiconductor film.

[Math. 3]

$$A + B \rightleftharpoons [A]^+[B]^- \quad (6)$$

The redox reaction of the organic semiconductor and the initiator dopant represented by the formula (6) is reversible, and, after the reaction has reached a state of equilibrium, the amount of the intermediate formed is not increased. That is, doping of the organic semiconductor film 24 with the initiator dopant does not proceed after reaching a state of equilibrium. However, when the alternative ion (anion $[D]^-$) which is more likely to chemically form a pair with the organic semiconductor than the initiator dopant (anion $[B]^-$) is present in the system, as shown in the formula (7) below, the initiator dopant (anion $[B]^-$) forming the intermediate is replaced (ion-exchanged) by the alternative ion (anion $[D]^-$) (FIG. 10(B)). This replacement causes a redox reaction of the organic semiconductor and the initiator dopant so as to maintain the state of equilibrium, and further the initiator dopant (anion, $[B]^-$) in the intermediate formed by the redox reaction is replaced by the alternative ion (anion, $[D]^-$).

[Math. 4]

$$[A]^+[B]^- + [D]^- \rightarrow [A]^+[D]^- + [B]^- \quad (7)$$

When the organic semiconductor film 24 is C8-DNBDT which is a P type organic semiconductor, the initiator dopant is $F_4TCNQ$, the alternative ion is $TFSI^-$, and the spectator ion is $EMMI^+$, the formulae (6) and (7) above are represented by the following formulae (8) and (9).

[Math. 5]

$$C_8DNBDT + F_4TCNQ \rightarrow [C_8DNBDT]^+[F_4TCNQ]^- \quad (8)$$

-continued

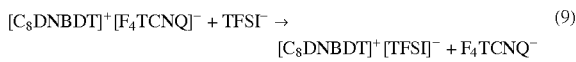
(9)

Figure 14:
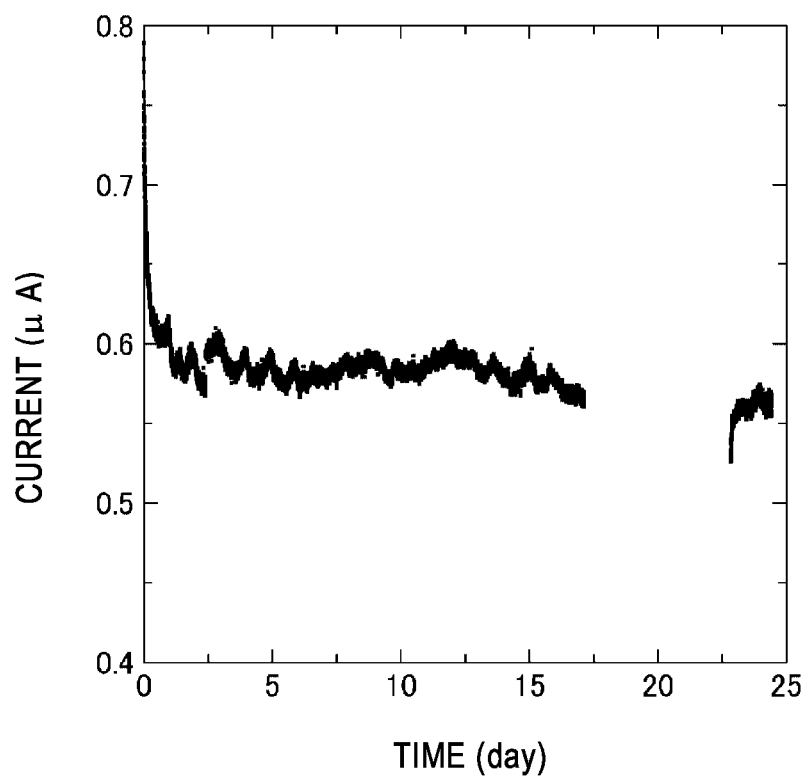
FIG. 14 A graph showing a change with time of a current which flows when applying a constant voltage to the organic semiconductor element.

As a result of the above reactions, a state is formed in which the surface of the organic semiconductor film 24 is doped with the alternative ion. In the organic semiconductor film 24 which is doped as mentioned above, the doping amount is large, as compared to that in the case of doping made by immersing the film in a solution having dissolved only an initiator dopant. In addition, the above-mentioned reactions are caused on the surface of the organic semiconductor film 24, and therefore doping can be advantageously made without causing the crystal structure of the organic semiconductor film 24 to be disordered. Further, it has been found that the organic semiconductor film 24 in the doped state has high stability to heat and high stability in air. With respect to the data showing the stability in air, FIG. 14 shows a change with time of the current flowing the organic semiconductor element 14 when applying a constant voltage to the organic semiconductor element. Similar data is obtained in the case where the organic semiconductor in the organic semiconductor film 24 is of an N type.

With respect to the P type organic semiconductor, there is used one which forms single crystal, and the HOMO level of which satisfies the predetermined requirement in respect of the LUMO level of the initiator dopant as mentioned below. With respect to the N type organic semiconductor, there is used one which forms single crystal, and the LUMO level of which satisfies the predetermined requirement in respect of the HOMO level of the initiator dopant as mentioned below. When the organic semiconductor film 24 is formed by the above-mentioned edge casting method, an organic semiconductor soluble in an organic solvent is used.

When using the P type organic semiconductor, as the initiator dopant, $F_4TCNQ$ is used. Further examples of such initiator dopants include 7,7,8,8-tetracyanoxydimethane and $Mo(tfd-COCF_3)_3$.

When using the P type organic semiconductor, the requirement: "VH1≤VL1+1.0 (eV)" is satisfied wherein the HOMO level of the organic semiconductor is VH1 (eV), and the LUMO level of the initiator dopant is VL1 (eV).

When using the P type organic semiconductor, as the alternative ion, an anion having a closed shell structure capable of forming a salt, together with the spectator ion, is used. Examples of such alternative ions include tetrafluoroborate (BF4), hexafluorophosphate (PF6), hexafluoroantimonate (SbF6), a carbonate ion, a sulfonate ion, a nitrate ion, a phosphate ion, a thiocyanate ion, a cyanate ion, a chloride ion, a bromide ion, an iodide ion, a triiodide ion, a fluoride ion, trifluoro[tri(pentafluoroethyl)]phosphate (FAP), bis(trifluoromethanesufonyl)imide (TFSI), bis(pentafluoroethanesufonyl)imide (TFESI), a bis(oxalato)borate ion (BOB), a bis(malonato)borate ion (MOB), a tetrakis (pentafluorophenyl)borate ion (PFPB), tetrakis(3 5-trifluoromethyl)phenylborate (TFPB), and an iron tetrachloride ion ($FeCl_4$).

When using the P type organic semiconductor, the spectator ion is a cation having a closed shell structure capable of forming a salt, together with the alternative ion. Examples of spectator ions include metal ions and metal ions modified with a cyclic ether or the like, organic molecular ions and derivatives thereof, Li, Na, Cs, Mg, Ca, Cu, Ag, imidazolium, morpholinium, piperidinium, pyridinium, pyrrolidinium, ammonium, and phosphonium.

When using the N type organic semiconductor, as the initiator dopant, cobaltocene is used. Examples of such initiator dopants include decamethylcobaltocene, ruthenocene, ferrocene, and 1,3-dimethyl-2-phenyl-2,3-dihydrobenzoimidazole.

When using the N type organic semiconductor, the requirement: "VL2≥VH2−1.0 (eV)" is satisfied wherein the LUMO level of the organic semiconductor is VL2 (eV), and the HOMO level of the initiator dopant is VH2 (eV).

When using the N type organic semiconductor, as the alternative ion, a cation having a closed shell structure capable of forming a salt, together with the spectator ion, is used. Examples of such alternative ions include metal ions and metal ions modified with a cyclic ether or the like, organic molecular ions and derivatives thereof, Li, Na, Cs, Mg, Ca, Cu, Ag, imidazolium, morpholinium, piperidinium, pyridinium, pyrrolidinium, ammonium, and phosphonium.

The spectator ion of the N type is an anion having a closed shell structure capable of forming a salt, together with the alternative ion. Examples of spectator ions include tetrafluoroborate (BF4), hexafluorophosphate (PF6), hexafluoroantimonate (SbF6), a carbonate ion, a sulfonate ion, a nitrate ion, a phosphate ion, a thiocyanate ion, a cyanate ion, a chloride ion, a bromide ion, an iodide ion, a triiodide ion, a fluoride ion, FAP, TFSI, TFESI, BOB, MOB, PFPB, TFPB, and $FeCl_4$.

For achieving a reaction in which the initiator dopant forming the intermediate is replaced by the alternative ion, the system is controlled so that the Gibbs energy of the system is stabilized by pairing of the initiator dopant and the spectator on, or the Gibbs energy of the system is stabilized by pairing of the organic semiconductor and the alternative ion.

EXAMPLES

In Examples, using a sample having the sensor portion S formed on the substrate 12, properties of the organic semiconductor element 14 were measured. In the sample, the organic semiconductor element 14 was formed in the middle of the substrate 12 as viewed in the longitudinal direction of the substrate, and the sample was curved at the middle of the substrate 12 in each measurement. The sensor portion S had a structure in which, as shown in FIG. 9, the electrodes 16, 17 are individually formed in a shape like the teeth of a comb, and the organic semiconductor element 14 is formed between each electrode 16 and each electrode 17. Each sample has no leg 13.

Figure 11:
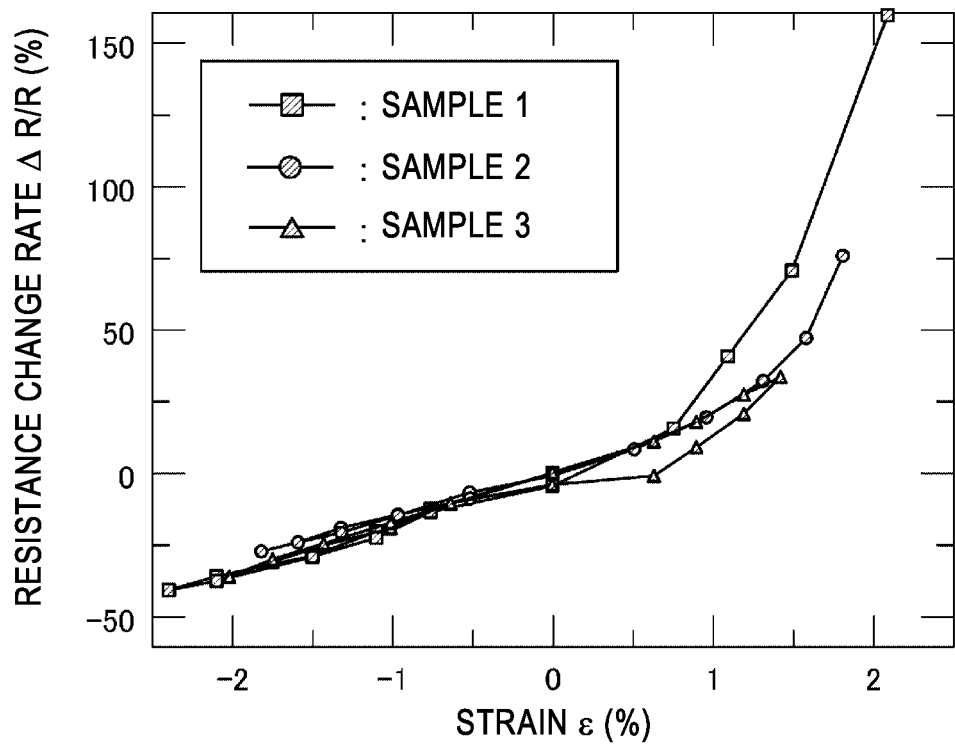
FIG. 11 A graph showing the relationship between the strain of the organic semiconductor element and a resistance change rate.

FIG. 11 shows the results of the measurement of a resistance change rate in relation to strain ε with respect to samples 1 to 3 prepared using different dopant films 25. In the samples 1 to 3, the organic semiconductor film 24 was formed from single crystal of C8-DNBDT. With respect to the dopant constituting the dopant film 25, $Mo(tfd-COCF_3)_3^-$ was used in the sample 1, $SbF_6^-$ was used in the sample 2, and $TFSI^-$ was used in the sample 3. In the sample 1, $Mo(tfd-COCF_3)_3$ was used as a dopant material, and, in the sample 2, $NO^+SbF_6^-$ was used as a dopant material, and the dopant film 25 was formed by a method of immersing the organic semiconductor film 24 in a solution having each dopant material dissolved in a solvent. In the sample 3, $F_4TCNQ$ was used as the initiator dopant, $TFSI^-$ was used as the alternative ion, $EMMI^+$ was used as the spectator ion, and doping was conducted using the above-mentioned ion exchange method.

The strain ε was "positive" in the case that the organic semiconductor element 14 is stretched, and "negative" in the case that the organic semiconductor element 14 is compressed, and was determined from "ε=h/2r" wherein a thickness of the substrate 12 is taken as h, and a curvature radius of the organic semiconductor element 14 is taken as r. The resistance change rate was determined from "ΔR/R× 100(%)" wherein a resistance of the organic semiconductor element 14 measured when the substrate 12 is not deformed is taken as R, and an increase of the resistance of the organic semiconductor element 14 measured when the substrate 12 is deformed is taken as ΔR. A change of the resistance of the organic semiconductor element 14 was determined from the output voltage of a bridge circuit to which the lead wires 18, 19 were connected.

As can be seen from the graph of FIG. 11, irrespective of the dopant and the method for doping, the relationship between the resistance change rate and the strain ε was almost the same. A gage rate k (=(ΔR/R)/ε) of the samples 1 to 3 in the compression direction was about 20, which is about 10 times the value obtained when using a metal as a strain detecting element. The gage rate k of the organic semiconductor element 14 in the stretching direction was larger than that in the compression direction.

Figure 12:
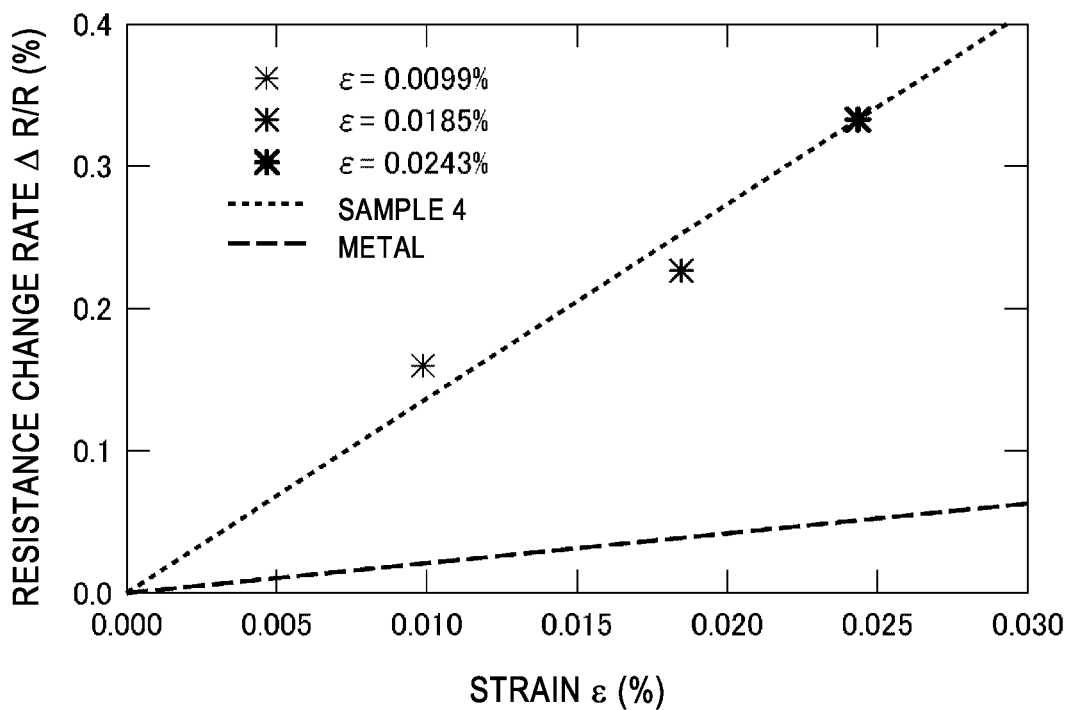
FIG. 12 A graph showing the relationship between the very small strain of the organic semiconductor element and the resistance change rate.

Further, FIG. 12 shows the results of the measurement of a resistance change rate in relation to very small strain ε with respect to a sample 4. In the sample 4, the organic semiconductor film 24 was formed from single crystal of C10-DNBDT, and the organic semiconductor element 14 was prepared by an ion exchange method using TFSI⁻ as a dopant. As can be seen from the graph of FIG. 12, the organic semiconductor element 14 can detect even a very small strain ε of 0.01% or less with high sensitivity. The gage rate k of the organic semiconductor element 14 in the region of the very small strain measured was 14, which indicates a result that the sensitivity is higher than the value obtained when using a metal as an element (K=2).

Figure 13:
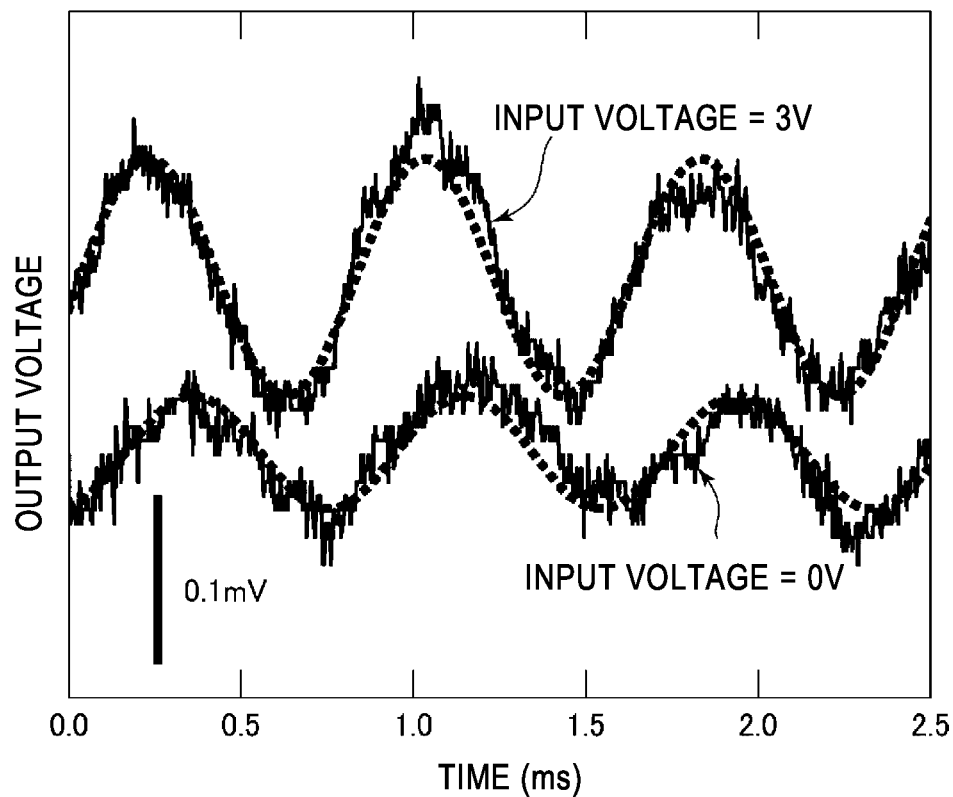
FIG. 13 A graph showing a change of an output voltage when vibrating the vibration sensor at a high speed.

FIG. 13 shows the results of the measurement of an output voltage from the bridge circuit having connected thereto the sensor portion S with respect to the sample 4 when mechanically vibrating in the vertical direction the middle portion of the substrate 12, both ends of which were fixed. In this measurement, the frequency of vibration was 1,300 Hz, and the amplitude was 5 μm, and the measurement was made in respect of two types of input voltages, i.e., 3 V and 0 V. When the input voltage was 0 V, it is considered that an output voltage is generated by an effect of electromagnetic induction caused due to movement of the circuit of the sensor portion S at a high speed in the environmental magnetic field.

There is a large difference between the output voltage measured for the input voltage of 3 V and the output voltage measured for the input voltage of 0 V, and this shows that, with respect to the output voltage for the input voltage of 3 V, the organic semiconductor element 14 responds to the vibration at 1,300 Hz to cause the output voltage to be changed. From the result, it is found that the organic semiconductor element 14 has a response speed of 1 ms or less. Further, it is apparent that the organic semiconductor element has such high sensitivity that an amplitude as very small as 5 μm can be detected.

As is apparent from the above results, the organic semiconductor film 24 having the doped layer 26 formed from the dopant film 25 is advantageous in that a desired resistance can be obtained without causing the single crystal structure to be disordered.

REFERENCE SIGNS LIST

10: Vibration sensor
12: Substrate
14: Organic semiconductor element
16, 17: Electrode
24: Organic semiconductor film
25: Dopant film
26: Doped layer
50: Treatment liquid

The invention claimed is:

1. A strain sensor comprising:
an organic semiconductor element comprising:
   an organic semiconductor film formed from single crystal of an organic semiconductor; and
   a doped layer formed in a surface of the organic semiconductor film;
a pair of electrodes which are electrically connected through the doped layer; and
a substrate which is deformable, and which has the organic semiconductor element formed on one surface thereof.

2. A vibration sensor comprising:
an organic semiconductor element comprising:
   an organic semiconductor film formed from single crystal of an organic semiconductor; and
   a doped layer formed in a surface of the organic semiconductor film;
a pair of electrodes which are electrically connected through the doped layer; and
a substrate which has flexibility, and which is fixed at one end or both ends thereof, the substrate having the organic semiconductor element formed on the surface of the flexible portion of the substrate.

3. A method for producing an organic semiconductor element, comprising:
forming an organic semiconductor film formed from single crystal of an organic semiconductor on a substrate; and
forming a dopant film for supplying carriers to a surface of the organic semiconductor film, wherein, in forming a dopant film, a treatment liquid, which is obtained by dissolving, in an ionic liquid including a first ion which serves as a dopant in the form of a cation or an anion or an organic solvent having dissolved therein a salt including a first ion which serves as a dopant in the form of a cation or an anion, a second ion which has the same polarity as that of the first ion and which oxidizes or reduces the organic semiconductor, is allowed to be in contact with the surface of the organic semiconductor film to form an intermediate of the second ion and the organic semiconductor by a redox reaction, and to replace the second ion in the intermediate with the first ion.

4. The strain sensor according to claim 1, wherein the organic semiconductor element further comprising a dopant film, formed on the surface of the organic semiconductor film, for supplying carriers to the surface of the organic semiconductor film to form the doped layer.

5. The vibration sensor according to claim 2, wherein the organic semiconductor element further comprising a dopant film, formed on the surface of the organic semiconductor film, for supplying carriers to the surface of the organic semiconductor film to form the doped layer.

\* \* \* \* \*